(12) United States Patent
Kim et al.

(10) Patent No.: US 9,287,299 B2
(45) Date of Patent: Mar. 15, 2016

(54) BACK PLANE FOR FLAT PANEL DISPLAY AND METHOD OF MANUFACTURING THE SAME

(71) Applicant: Samsung Display Co., Ltd., Yongin, Gyeonggi-Do (KR)

(72) Inventors: Min-Kyu Kim, Yongin (KR); Yeon-Gon Mo, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/975,174

(22) Filed: Aug. 23, 2013

(65) Prior Publication Data

US 2014/0183538 A1 Jul. 3, 2014

(30) Foreign Application Priority Data

Jan. 3, 2013 (KR) .................. 10-2013-0000633

(51) Int. Cl.
*H01L 27/12* (2006.01)

(52) U.S. Cl.
CPC ........ *H01L 27/1288* (2013.01); *H01L 27/1255* (2013.01)

(58) Field of Classification Search
None
See application file for complete search history.

(56) References Cited

U.S. PATENT DOCUMENTS

| | | | |
|---|---|---|---|
| 7,435,631 B2 | 10/2008 | Yang | |
| 7,893,440 B2* | 2/2011 | Kwon et al. | 257/72 |
| 8,106,402 B2* | 1/2012 | Yeo et al. | 257/72 |
| 8,143,699 B2 | 3/2012 | Ching et al. | |
| 2007/0238227 A1* | 10/2007 | Jun et al. | 438/149 |
| 2008/0283841 A1* | 11/2008 | Yamayoshi | 257/71 |
| 2009/0278131 A1* | 11/2009 | Kwon et al. | 257/72 |
| 2010/0270538 A1* | 10/2010 | Kang | 257/40 |
| 2011/0278615 A1* | 11/2011 | No et al. | 257/98 |
| 2011/0303921 A1* | 12/2011 | Shin et al. | 257/71 |
| 2012/0001191 A1* | 1/2012 | Ma et al. | 257/71 |
| 2012/0104399 A1* | 5/2012 | Choi et al. | 257/59 |
| 2012/0146031 A1* | 6/2012 | Lee | 257/59 |
| 2012/0292612 A1* | 11/2012 | Jeong et al. | 257/43 |
| 2012/0298984 A1* | 11/2012 | Park et al. | 257/43 |

FOREIGN PATENT DOCUMENTS

| | | |
|---|---|---|
| KR | 10-2006-0077895 A | 7/2006 |
| KR | 10-2007-0051159 A | 5/2007 |
| KR | 10-2010-0074611 A | 7/2010 |
| KR | 10-2010-0097010 A | 9/2010 |

* cited by examiner

*Primary Examiner* — Charles Garber
*Assistant Examiner* — Alia Sabur
(74) *Attorney, Agent, or Firm* — Lewis Roca Rothgerber Christie LLP

(57) ABSTRACT

There are provided a back plane for a flat panel display and a method of manufacturing the back plane, and more particularly, a back plane for an organic light-emitting display device, which enables front light-emitting, and a method of manufacturing the back plane. The back plane for a flat panel display includes: a substrate; a gate electrode on the substrate; a first capacitor on the substrate, the first capacitor comprising a first electrode, an insulation pattern layer on the first electrode, and a second electrode on the insulation pattern layer; a first insulation layer on the substrate to cover the gate electrode and the first capacitor; an active layer on the first insulation layer to correspond to the gate electrode; and a source electrode and a drain electrode on the substrate to contact a portion of the active layer.

25 Claims, 5 Drawing Sheets

BACK PLANE FOR FLAT PANEL DISPLAY AND METHOD OF MANUFACTURING THE SAME

CROSS-REFERENCE TO RELATED PATENT APPLICATION

This application claims priority to and the benefit of Korean Patent Application No. 10-2013-0000633, filed on Jan. 3, 2013, in the Korean Intellectual Property Office, the disclosure of which is incorporated herein in its entirety by reference.

BACKGROUND

1. Field

The present invention relates to a back plane for a flat panel display and a method of manufacturing the back plane.

2. Description of the Related Art

A flat panel display such as an organic light-emitting display device or a liquid crystal display (LCD) may be manufactured on a substrate on which a pattern including at least one driving thin film transistor (TFT), a capacitor, and wiring coupling (or connecting) the driving TFT to the capacitor is formed to drive the flat panel displays. The driving TFT may include a gate electrode, an active layer that is electrically insulated from the gate electrode by a gate insulation layer, a source electrode that is electrically coupled (or connected) to the active layer, and a drain electrode that is electrically coupled (or connected) to the active layer. In addition, a flat panel display may include a switching transistor for controlling the driving TFT.

In general, in order to form a minute pattern including a TFT, or the like, on a substrate in which a flat panel display is manufactured, a mask on which the minute pattern is drawn is used to transfer the minute pattern on (or to) the substrate.

Because a process of transferring patterns on (or to) a substrate uses masks including patterns, manufacturing cost for mask preparation increases as the number of process steps using masks increases. In addition, manufacturing process may be complicated due to complicated steps, and thus, manufacturing time and manufacturing cost may increase.

Recently, low resistance wiring has been used to achieve high density and high resolution organic light-emitting display devices, and the number of process steps for manufacturing the organic light-emitting display devices have increased due to the complexity of the structures thereof.

SUMMARY

Aspects of the present invention provide a back plane for a flat panel display, which is capable of being applied to a high resolution and high density flat panel display, and which reduces the number of patterning process steps using a mask, and has improved (or high) quality.

Additional aspects of the present invention will be set forth, in part, in the description which follows and, in part, will be apparent from the description, or may be learned by practice of the presented embodiments.

According to an embodiment of the present invention, there is provided a back plane for a flat panel display, the back plane including: a substrate; a gate electrode on the substrate; a first capacitor on the substrate, the first capacitor including a first electrode, an insulation pattern layer on the first electrode, and a second electrode on the insulation pattern layer; a first insulation layer on the substrate to cover the gate electrode and the first capacitor; an active layer on the first insulation layer to correspond to the gate electrode; and a source electrode and a drain electrode on the substrate to contact a portion of the active layer.

The back plane may further include a third electrode corresponding to the first capacitor, and at a same layer as the source electrode and the drain electrode.

The back plane may further include a second insulation layer on the first insulation layer to cover the active layer, the second insulation layer including a first hole and a second hole for exposing a portion of the active layer, wherein the source electrode and the drain electrode are on the second insulation layer and filling the first hole and the second hole.

The back plane may further include a third insulation layer on the first insulation layer to cover the source electrode, the drain electrode, and the third electrode, wherein the third insulation layer may include a third hole for exposing a portion of the source electrode or drain electrode.

The back plane may further include a pixel electrode on the third insulation layer and fill the third hole and electrically coupled to the source electrode or the drain electrode through the third hole.

The back plane may further include a fourth electrode on the third insulation layer and corresponding to the first capacitor.

The back plane may further include: a fourth insulation layer covering an edge of the pixel electrode on the third insulation layer and including an opening for exposing at least a portion of the pixel electrode; an intermediate layer on the pixel electrode exposed by the opening and including an organic light emission layer; and an opposite electrode opposite to the pixel electrode, the intermediate layer interposed between the opposite electrode and the pixel electrode.

The first electrode may include a same material as the gate electrode.

The active layer may include an oxide semiconductor.

The gate electrode and the first capacitor may be by using a half-tone mask.

Locations of lateral sides of the first electrode, insulation pattern layer, and second electrode may be identical to each other.

A dielectric constant of the insulation pattern layer may be higher than that of the first insulation layer.

The insulation pattern layer may include at least one material selected from among ZrOx, HfOx, AlOx, SiNx, SiNOx, and SiOx.

According to another embodiment of the present invention, there is provided a method of manufacturing a back plane for a flat panel display, the method including: forming a first capacitor and a gate electrode on a substrate, the first capacitor including a first electrode, an insulation pattern layer on the first electrode, and a second electrode on the insulation pattern layer; forming a first insulation layer on the substrate to cover the first capacitor and the gate electrode; forming an active layer on the first insulation layer to correspond to the gate electrode; forming a second insulation layer, which covers the active layer while providing first and second holes for exposing a portion of the active layer, on the first insulation layer; and forming a source electrode and a drain electrode on the substrate to contact a portion of the active layer.

The forming the source electrode and drain electrode may include further forming a third electrode corresponding to the first capacitor.

The source electrode and the drain electrode may be on the second insulation layer and fill the first hole and the second hole.

The method may further include forming a third insulation layer on the second insulation layer to cover the source electrode, the drain electrode, and the third electrode, wherein the third insulation layer includes a third hole for exposing a portion of the source electrode or drain electrode.

The method may further include forming a pixel electrode on the third insulation layer and filling the third hole, the pixel electrode being electrically coupled to the source electrode or the drain electrode through the third hole.

The forming the pixel electrode may further include forming a fourth electrode on the third insulation layer to correspond to the first capacitor.

The method may further include forming a fourth insulation layer to cover an edge of the pixel electrode on the third insulation layer, the fourth insulation layer including an opening for exposing at least a portion of the pixel electrode.

The method may further include forming an intermediate layer including an organic light emission layer on the pixel electrode exposed by the opening; and forming an opposite electrode opposite to the pixel electrode, the intermediate layer interposed between the opposite electrode and the pixel electrode.

The first electrode may comprise a same material as the gate electrode.

The active layer may include an oxide semiconductor.

The forming the first capacitor and the gate electrode may include forming the gate electrode and the first capacitor by using a half-tone mask.

Locations of lateral sides of the first electrode, the insulation pattern layer, and the second electrode may be identical to each other.

A dielectric constant of the insulation pattern layer may be higher than that of the first insulation layer.

The insulation pattern layer may include at least one material selected from among ZrOx, HfOx, AlOx, SiNx, SiNOx, and SiOx.

BRIEF DESCRIPTION OF THE DRAWINGS

The above and other features and aspects of the present invention will become more apparent by describing in detail example embodiments thereof with reference to the attached drawings in which.

DETAILED DESCRIPTION

Figure 1:
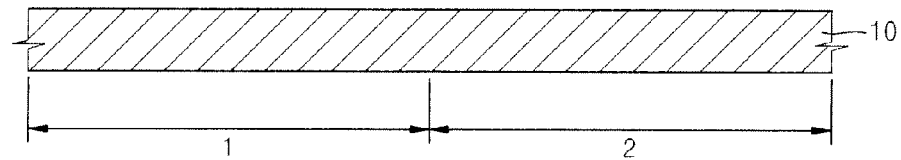
FIGS. 1 through 12 are schematic cross-sectional views illustrating a method of manufacturing a back plane for a flat panel display, according to embodiments of the present invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. For purposes of clarity, in the following description of embodiments of the present invention, a detailed description of available technologies may not be provided if they are deemed to obscure the features of the present invention.

While such terms as "first," "second," etc., may be used to describe various components, such components must not be limited to the above terms. The above terms are used only to distinguish one component from another.

The terms used in the present specification are merely used to describe particular embodiments, and are not intended to limit the present invention. An expression used in the singular encompasses the expression in the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

The present invention will now be described more fully with reference to the accompanying drawings in which example embodiments of the invention are shown.

FIGS. 1 through 12 are schematic cross-sectional views illustrating a method of manufacturing a back plane for a flat panel display, according to embodiments of the present invention.

First, a substrate 10 is prepared as illustrated in FIG. 1. The substrate 10 may be formed of a transparent glass material including SiO2 as a main component. However, although the flat panel display, according to an embodiment of the present invention, enables front light-emitting, the substrate 10 is not limited thereto. That is, the substrate 10 may be formed of an opaque material, and a substrate formed of one of various materials such as a plastic material, a metal material, and the like may be used as the substrate 10.

Referring to FIG. 1, the back plane for a flat panel display includes a transistor area 1 and a storage area 2.

An auxiliary layer (not shown) such as a barrier layer, a blocking layer, and/or a buffer layer may be formed on the substrate 10 to prevent impurity ions from being diffused, to prevent the permeation of moisture or external air, and/or to planarize the surface of the substrate 10. The auxiliary layer (not shown) may be formed through one of various deposition methods, such as a plasma enhanced chemical vapor deposition (PECVD) method, an atmospheric pressure CVD (APCVD) method, a low pressure CVD (LPCVD) method, and the like, by using SiO2 and/or SiNx.

Figure 2:
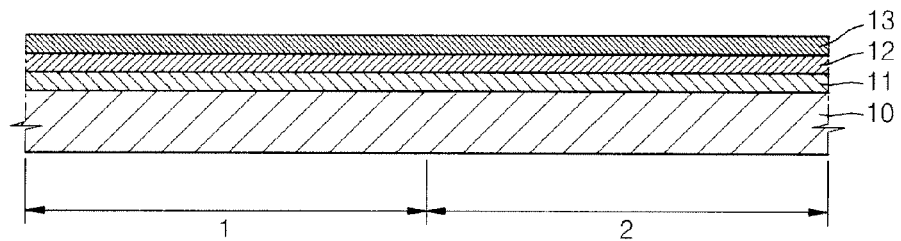

Next, as illustrated in FIG. 2, a first conductive layer 11, a dielectric layer 12, and a second conductive layer 13 are formed in turn on the substrate 10. The first conductive layer 11 and the second conductive layer 13 each may include at least one material selected from among Ag, Mg, Al, Pt, Pd, Au, Ni, Nd, Ir, Cr, Li, Ca, Mo, Ti, W, MoW, and Cu. However, the first and second conductive layers 11 and 13 are not limited thereto and may be formed of any conductive material including a metal.

Resistivity of the first conductive layer 11 may be higher than that of the second conductive layer 13. For example, the first conductive layer 11 may include a material having resistivity of about 0.5 ohm/square to 1 ohm/square, and the second conductive layer 13 may include a material having resistivity of about 0.1 ohm/square.

The dielectric layer 12 may include a material having a dielectric constant that is higher than that of a material constituting a first insulation layer 20 that is described below. Examples of such a material include ZrOx, HfOx, AlOx, and the like, but are not limited thereto. A CVD method may be used to form the dielectric layer 12. Alternatively, an atomic layer deposition (ALD) method may be used to form the dielectric layer 12.

A material constituting the dielectric layer 12 is not limited thereto and may include a material that is the same as that constituting the first insulation layer 20. Examples of such a material include SiOx, SiONx, SiNx, or the like, and the material may be deposited by using a method such as the CVD method or a plasma vapor deposition (PVD) method using sputtering.

Figure 3:
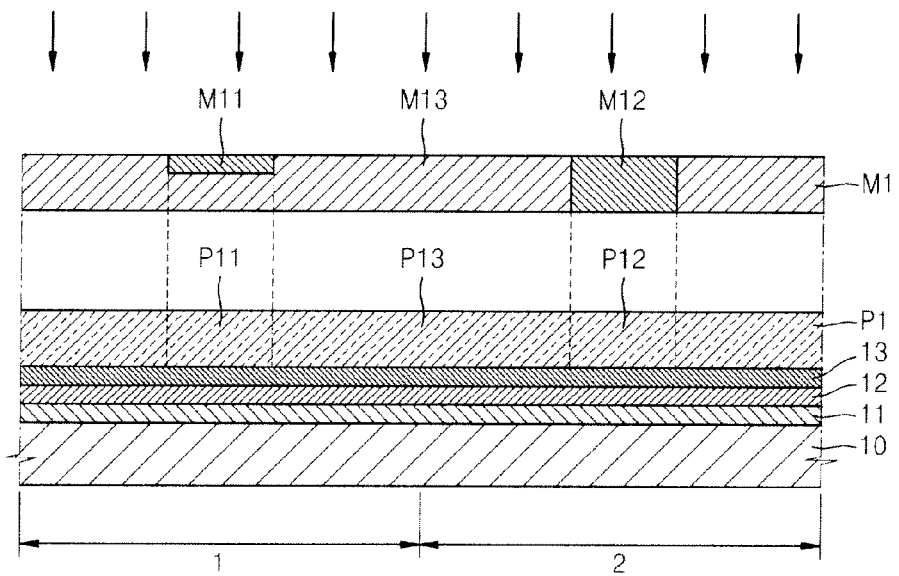

Next, as illustrated in FIG. 3, a photoresist layer P1 is formed by removing a solvent with pre-baking or soft baking with respect to a photoresist coated on a resultant structure of FIG. 2, and then a first mask M1 on which a pattern (e.g., a predetermined pattern) is drawn is aligned on the substrate 10 to pattern the photoresist layer P1.

The first mask M1 may be a half-tone mask including a semi-transmission portion M11, a light blocking portion M12, and a light transmission portion M13. The light transmission portion M13 transmits light of a wavelength range (e.g., a predetermined wavelength range), the light blocking portion M12 blocks light that is radiated thereto, and the semi-transmission portion M11 transmits a portion of light that is radiated thereto.

In FIG. 3, the half-tone mask M1 is conceptually illustrated to explain a function of each portion thereof. The half-tone mask M1 may be obtained by forming a pattern (e.g., a predetermined pattern) on a transparent substrate such as quartz (Qz). In this case, the light blocking portion M12 may be patterned by using a material such as Cr, CrO2, or the like, on a quartz substrate. In addition, the semi-transmission portion M11 may be patterned by using at least one material selected from among Cr, Si, Mo, Ta, and Al, and the light transmissivity of the semi-transmission portion M11 may be adjusted by adjusting a composition element ratio thereof or a thickness thereof.

The first mask M1 including patterns as above is aligned on the substrate 10, and a light exposure is performed by radiating light of a wavelength range (e.g. a predetermine wavelength range) on the photoresist layer P1 through the first mask M1.

Figure 4:
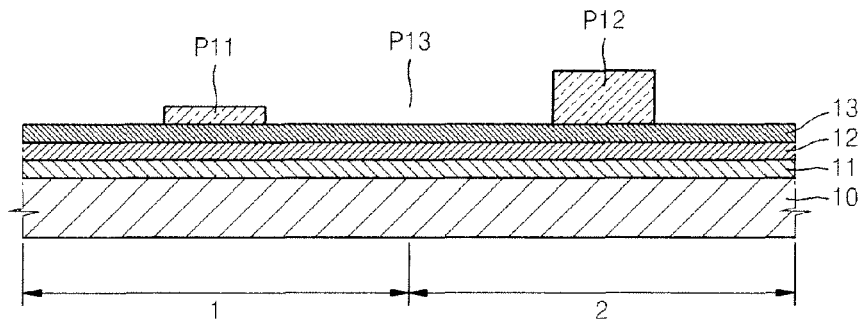

Referring to FIG. 4, photoresist patterns that remain after performing a developing process of removing an exposed portion of the photoresist layer P1 are illustrated. In this embodiment, a positive photoresist is used, in which an exposed portion is removed. However, the present invention is not limited thereto, and a negative photoresist may also be used.

Referring to FIG. 4, a photoresist layer portion P13 corresponding to the light transmission portion M13 of the half-tone mask M1 is removed, and a photoresist layer portion P12 corresponding to the light blocking portion M12 and a photoresist layer portion P11 corresponding to the semi-transmission portion M11 remain. In this case, the thickness of the photoresist layer portion P11 is smaller than that of the photoresist layer portion P12, and the thickness of the photoresist layer portion P11 may be adjusted by controlling an element ratio or thickness of a material constituting the semi-transmission portion M11 in the half-tone mask M1.

The first conductive layer 11, the dielectric layer 12, and the second conductive layer 13 on the substrate 10 are etched by using photoresist layer patterns, such as the photoresist layer portions P11 and P12, as a mask. In this embodiment, a structure located (or positioned) under an area where the photoresist layer is removed is first etched, and a structure located (or positioned) under an area (the photoresist layer portions P11 and P12) where the photoresist layer remains is partially etched. In this case, the etching process may be performed with various methods such as wet etching and dry etching.

Figure 5:
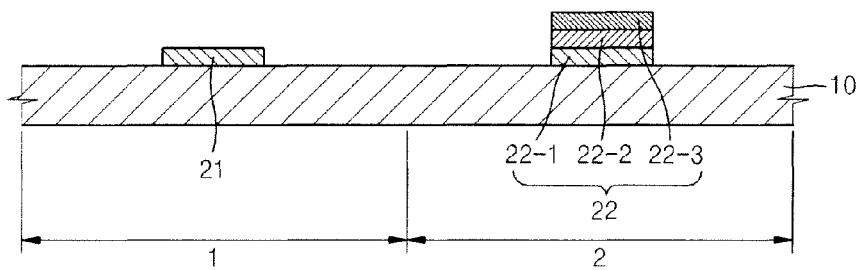

Referring to FIGS. 4 and 5, during the etching process, a portion of the first conductive layer 11, a portion of the dielectric layer 12, and a portion of the second conductive layer 13, which are located (or positioned) under the area where the photoresist layer portion P13 is removed, are etched. In addition, a portion of the first conductive layer 11, a portion of the dielectric layer 12, and a portion of the second conductive layer 13, which are located (or positioned) under the photoresist layer portion P11 corresponding to the semi-transmission portion M11 of FIG. 3, are etched, but a first conductive layer pattern 21 that is located (or positioned) under the photoresist layer portion P11 remains without being etched. In the area where the photoresist layer portion P12 corresponding to the light blocking portion M12 of FIG. 3 remains, only the photoresist layer portion P12 is etched and a second conductive layer pattern 22-3, a dielectric layer pattern 22-2, and a first conductive layer pattern 22-1, which are located (or positioned) under the photoresist layer portion P12, remain without being etched. According to an embodiment, the first conductive layer pattern 21 that remains in an area corresponding to the semi-transmission portion M11 of FIG. 3 is a gate electrode 21 of the transistor area 1. Likewise, the first conductive layer pattern 22-1, the dielectric layer pattern 22-2, and the second conductive layer pattern 22-3, which remain in an area corresponding to the light blocking portion M12 of FIG. 3, are a first electrode 22-1, an insulation pattern layer 22-2, and a second electrode 22-3 of a first capacitor 22 of the storage area 2, respectively.

As such, the gate electrode 21 of the transistor area 1 and the first capacitor 22 of the storage area 2 may be concurrently (e.g. simultaneously) patterned by using the same single half-tone mask M1 on the same structure. Thus, the gate electrode 21 and the first electrode 22-1 of the first capacitor 22 may be formed of the same material in the same layer. In addition, because the first electrode 22-1, the insulation pattern layer 22-2, and the second electrode 22-3 of the first capacitor 22 are concurrently (e.g. simultaneously) patterned with the same single half-tone mask M1, positions and shapes of lateral sides of the first electrode 22-1, insulation pattern layer 22-2, and second electrode 22-3 of the first capacitor 22 may be substantially identical (or identical) to each other.

Through a first mask process as described above, the gate electrode 21 and the first capacitor 22, which includes the first electrode 22-1, the insulation pattern layer 22-2 formed on the first electrode 22-1, and the second electrode 22-3 formed on the insulation pattern layer 22-2, are formed on the substrate 10.

As described above, the resistivity of the first conductive layer 11 may be higher than that of the second conductive layer 13. Accordingly, the gate electrode 21 and the first electrode 22-1 may include a high resistive metal and the second electrode 22-3 may include a low resistive metal. In addition, the dielectric layer 12 may include at least one material selected from among ZrOx, HfOx, and AlOx, each of which has a dielectric constant that is higher than that of a material constituting the first insulation layer 20 that is described below. However, the dielectric layer 12 is not limited thereto, and may include at least one material selected from among SiNx, SiNOx, and SiOx.

When the first mask process is completed, the gate electrode 21 including a high resistive metal is formed in the transistor area 1, and the first capacitor 22 is formed in the storage area 2. The first capacitor 22 includes the first electrode 22-1 formed of a high resistive metal, the insulation pattern layer 22-2 having a high dielectric constant, and the second electrode 22-3 formed of a low resistive metal.

If the insulation pattern layer 22-2 includes at least one material selected from among ZrOx, HfOx, and AlOx, the first capacitor 22 may have a high capacitance because the first capacitor 22 includes the insulation pattern layer 22-2 having a high dielectric constant as a dielectric layer.

Figure 6:
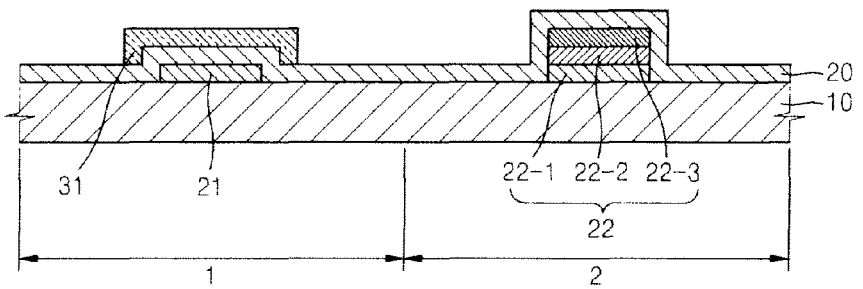

Referring to FIG. 6, the first insulation layer 20 is formed on the structure of FIG. 5 that is obtained as a result of the first mask process, and an active layer 31 may be formed on the first insulation layer 20 by a patterning process. Thus, the first insulation layer 20 is formed to cover the first capacitor 22 and the gate electrode 21, and the active layer 31 may be formed on the first insulation layer 20 to correspond to the gate electrode 21.

The first insulation layer 20 may be formed by depositing an inorganic insulation film, such as SiNx, SiOx, or the like, with the PECVD method, the APCVD method, or the LPCVD method. A portion of the first insulation layer 20 is interposed between the active layer 31 of the transistor area 1 and the gate electrode 21 and thus serves as a gate insulation layer of the transistor area 1, and another portion of the first insulation layer 20 is stacked on the second electrode 22-3 of the first capacitor 22.

Although a process of forming the active layer 31 is not illustrated in FIGS. 1 through 12, the active layer 31 may be formed, for example, by depositing a conductive layer and forming a photoresist layer on the conductive layer, aligning a second mask (not shown) on the substrate 10, radiating light of a wavelength range (e.g., a predetermined wavelength range) on the photoresist layer through the second mask to perform a light exposure, and etching the conductive layer by using a patterned photoresist layer as an etch stopper to leave only the active layer 31 that is not etched.

The active layer 31 may be formed of polycrystalline silicon. However, the active layer 31 is not limited thereto and may be formed of oxide semiconductor. The oxide semiconductor may include oxide of a material selected from group 12, 13, or 14 metallic elements, such as zinc (Zn), indium (In), gallium (Ga), tin (Sn), cadmium (Cd), germanium (Ge), and hafnium (Hf), and/or a combination thereof. For example, the active layer 31 may include G-I—Z—O[(In2O3)a(Ga2O3)b(ZnO)c] (where a, b, and c are real numbers that satisfies conditions a≥0, b≥0, and c>0, respectively).

Through the second mask process as described above, the first insulation layer 20 is formed on the substrate 10 to cover the first capacitor 22 and the gate electrode 21, and the active layer 31 is formed on the first insulation layer 20 to correspond to (or cover) the gate electrode 21.

Figure 7:
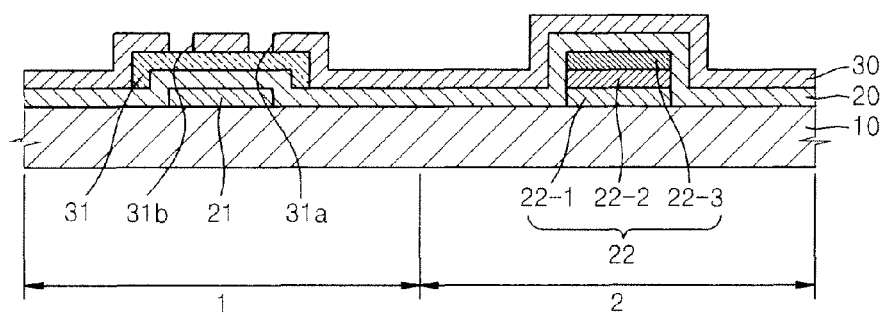

Referring to FIG. 7, a second insulation layer 30 may be deposited on a structure of FIG. 6 that is a result of the second mask process, and a patterning process may be performed on the second insulation layer 30. For example, the second insulation layer 30 is deposited on the structure of FIG. 6, and a portion of the second insulation layer 30 is etched to form first and second holes 31a and 31b for exposing a portion of the active layer 31. The second insulation layer 30 may protect the active layer 31. A first hole 31a and a second hole 31b may be formed by using one of various methods such as wet etching, dry etching, and the like. However, the active layer 31 located (or positioned) under the first and second holes 31a and 31b is not etched. As stated above, the second insulation layer 30 may perform a function of protecting the active layer 31.

Through a third mask process as described above, the second insulation layer 30, which covers the active layer 31 while providing the first and second holes 31a and 31b for exposing a portion of the active layer 31, is formed on the first insulation layer 20.

Figure 8:
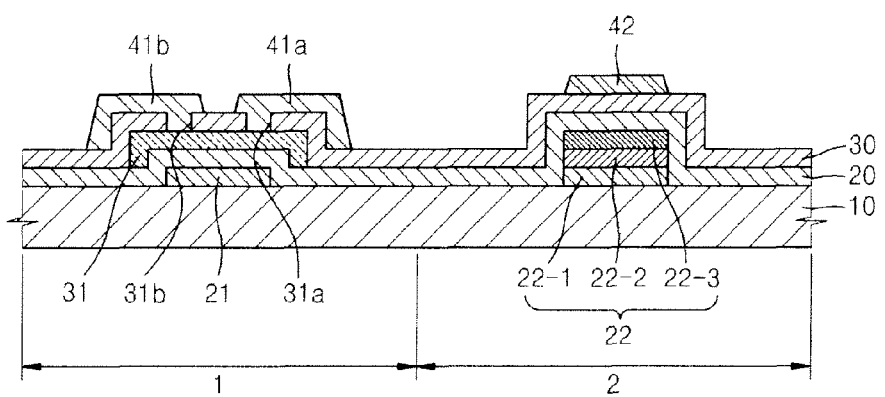

Next, as illustrated in FIG. 8, a source electrode 41a, a drain electrode 41b, and a third electrode 42 are formed on the structure of FIG. 7 that is a result of the third mask process. The source electrode 41a, the drain electrode 41b, and the third electrode 42 may each include at least one material selected from among Ag, Mg, Al, Pt, Pd, Au, Ni, Nd, Ir, Cr, Li, Ca, Mo, Ti, W, MoW, and Cu.

The source electrode 41a and the drain electrode 41b are formed on the second insulation layer 30 and fill the first hole 31a and the second hole 31b. The source electrode 41a contacts the active layer 31 by filling in the first hole 31a, the drain electrode 41b contacts the active layer 31 by filling in the second hole 31b, and the source electrode 41a and the drain electrode 41b are formed to be spaced apart from each other.

The third electrode 42 may be formed to correspond to the location (or position) of the first capacitor 22. Accordingly, the second electrode 22-3, the third electrode 42, and the first and second insulation layers 20 and 30 interposed between the second electrode 22-3 and the third electrode 42 may function as a capacitor.

To form the source electrode 41a, the drain electrode 41b, and the third electrode 42, a metal layer may be stacked on a structure of FIG. 7 and then may be selectively etched. In this embodiment, a fourth photo mask is used. The etching process may be performed with one of various methods such as wet etching, dry etching, and the like. The metal layer may include at least one material selected from among Ag, Mg, Al, Pt, Pd, Au, Ni, Nd, Ir, Cr, Li, Ca, Mo, Ti, W, MoW, and Cu.

As described above, through a fourth mask process, the source electrode 41a and the drain electrode 41b, which contact a portion of the active layer 31, and the third electrode 42 corresponding to the first capacitor 22 are formed on the second insulation layer 30.

Figure 9:
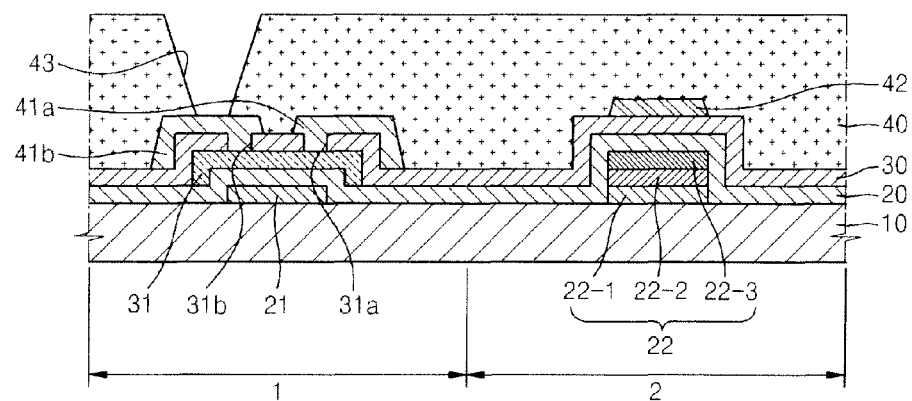

Next, as illustrated in FIG. 9, a fourth mask process is used to form a third insulation layer 40, whereby a third hole 43 is formed for exposing a portion of the source electrode 41a or drain electrode 41b.

The third hole 43 may be patterned and formed by a mask process using a fifth mask (not shown). The third hole 43 is formed to electrically couple (or connect) a pixel electrode (to be described below) to a thin film transistor (TFT) of the transistor area 1. Although in FIG. 9, the third hole 43 is formed to expose the drain electrode 41b, the present invention is not limited thereto. In addition, the location (or position) and form of the third hole 43 is not limited to those illustrated in FIG. 9 and may be implemented differently.

The third insulation layer 40 may be formed of at least one organic insulation material selected from, for example, polyimide, polyamide (PA), acryl resin, benzocyclobutene (BCB), and phenolic resin, and may be formed by using a method such as spin coating. The third insulation layer 40 may be formed of an inorganic insulation material selected from, for example, SiO2, SiNx, Al2O3, CuOx, Tb4O7, Y2O3, Nb2O5, and Pr2O3, instead of the above-described organic insulation material. The third insulation layer 40 may have a multi-layered structure by alternating an organic insulation material with an inorganic insulation material.

The third insulation layer 40 may be formed to have a thickness (e.g. a sufficient thickness), for example, to be thicker than the first insulation layer 20 or the second insulation layer 30. The third insulation layer 40 may serve as a planarization layer for planarizing the surface on which the pixel electrode (to be described below) is to be formed or may serve as a passivation layer for protecting the source and drain electrodes 41a and 41b of the transistor area 1 and the third electrode 42.

As described above, through a fifth mask process, the third insulation layer 40, in which the third hole 43 for exposing a portion of the source electrode 41a or drain electrode 41b is formed, is formed on the second insulation layer 30 to cover the source electrode 41a, the drain electrode 41b, and the third electrode 42.

Figure 10:
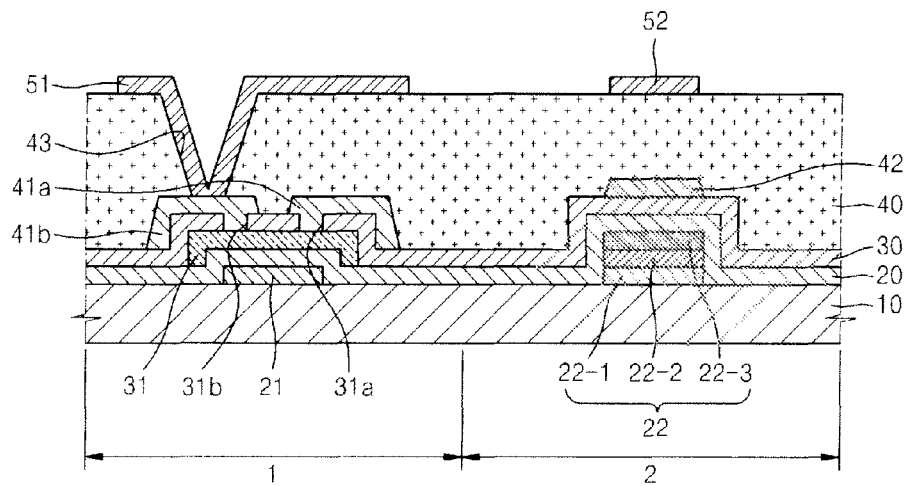

Next, as illustrated in FIG. 10, a pixel electrode 51 that is electrically coupled (or connected) to the source electrode 41a or the drain electrode 41b is formed on the third insulation layer 40. The pixel electrode 51 is electrically coupled (or connected) to the source electrode 41a or the drain electrode 41b, which is exposed by the third hole 43, and fills the third hole 43 of the third insulation layer 40.

While forming the pixel electrode 51, a fourth electrode 52 may be formed in the same layer as the pixel electrode 51. The fourth electrode 52 may be formed at a location (or position) corresponding to the third electrode 42 on the third insulation layer 40. Thus, the fourth electrode 52, the third electrode 42, and the third insulation layer 40 interposed between the fourth electrode 52 and the third electrode 42 may function as a capacitor. In addition, the fourth electrode 52 may be used as an auxiliary electrode to prevent a voltage drop of an opposite electrode 60 to be described below.

The pixel electrode 51 and the fourth electrode 52 may be patterned and formed by using a mask process using a sixth mask (not shown).

The pixel electrode 51 contacts the source electrode 41a or the drain electrode 41b through the third hole 43. The pixel electrode 51 may be formed of any of various materials based on the light emission type of the organic light emitting display. For example, in a bottom-emission type where an image is implemented (or projected) toward the substrate 1 or a dual-emission type where an image is implemented (or projected) both toward the substrate 1 and counter to the substrate 1, the pixel electrode 51 may be formed of a transparent metal oxide. The pixel electrode 51 may include at least one material selected from among ITO, IZO, ZnO, and In2O3. In these types, although not illustrated in the drawings, the pixel electrode 51 is designed not to overlap with the transistor area 1 and the storage area 2.

In a top-emission type where an image is implemented (or projected) counter to the substrate 1, the pixel electrode 51 may further include a reflective electrode formed of a material that reflects light. In this type, as illustrated in FIG. 10, the pixel electrode 51 may be designed to overlap with the transistor area 1 and the storage area 2.

Figure 11:
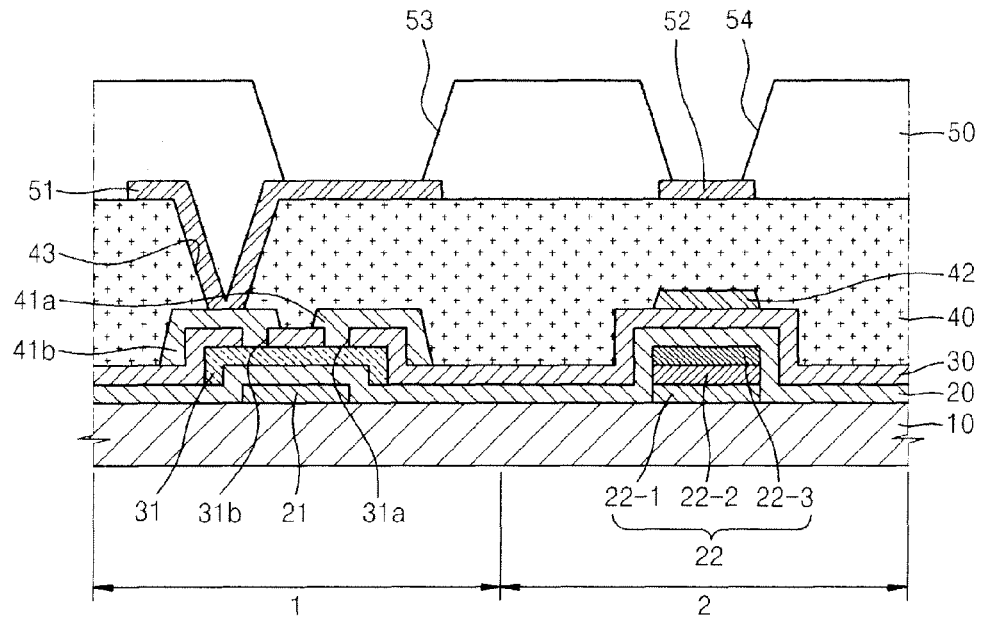

Next, as illustrated in FIG. 11, a fourth insulation layer 50 is formed to cover an edge of the pixel electrode 51 on the third insulation layer 40, and includes a first opening 53 for exposing at least a portion of the pixel electrode 51. The fourth insulation layer 50 may be also formed to cover an edge of the fourth electrode 52, and may further include a second opening 54 for exposing at least a portion of the fourth electrode 52. The fourth insulation layer 50 may be patterned and formed by using a mask process using a seventh mask (not shown).

Figure 12:
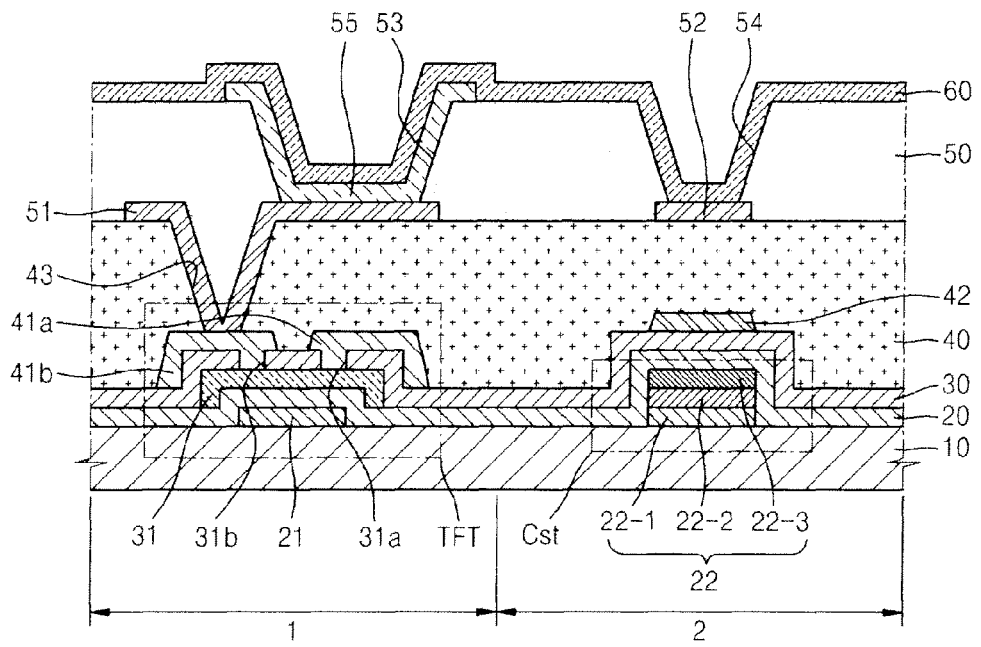

Next, as illustrated in FIG. 12, an intermediate layer 55 including an organic light emission layer is formed on the pixel electrode 51 exposed by the first opening 53 of FIG. 11, and the opposite electrode 60 may be formed opposite to the pixel electrode 51 with the intermediate layer 55 interposed therebetween.

The intermediate layer 55 may be formed by stacking an organic emission layer (EML) and at least one function layer selected from among a hole transport layer (HTL), a hole injection layer (HIL), an electron transport layer (ETL), and an electron injection layer (EIL). The intermediate layer 55 may be formed of a low-molecular weight organic material or a large-molecular weight organic material.

When the intermediate layer 55 is formed of a low-molecular weight organic material, the intermediate layer 55 is obtained by stacking the HTL and the HIL on a surface of the organic emission layer facing the pixel electrode 51 and stacking the ETL and the EIL on a surface of the organic emission layer facing the opposite electrode 60. Various other layers may be stacked if necessary. Examples of organic materials that may be used to form the organic emission layer include any of various materials such as copper phthalocyanine (CuPc), N,N'-di(naphthalene-1-yl)-N,N'-diphenyl-benzidine (NPB), and tris-8-hydroxyquinoline aluminum (Alq3).

When the intermediate layer 55 is formed of a high-molecular weight organic material, the intermediate layer 55 may be formed by stacking only a HTL on the surface of the organic emission layer facing the pixel electrode 51. The HTL may be formed of poly-(2,4)-ethylene-dihydroxy thiophene (PEDOT), polyaniline (PANI), or the like on the upper surface of the pixel electrode 51 by inkjet printing or spin coating. High-molecular weight organic materials such as polyphenylenevinylenes (PPVs) and polyfluorenes may include organic materials that may be used to form the organic emission layer. A color pattern may be formed by using a typical method such as inkjet printing, spin coating, or a thermal transfer method using a laser.

The organic emission layer may form a unit pixel with sub pixels that emit red light, green light, and blue light.

The opposite electrode 60 may be formed on the entire surface of the substrate 1 so as to serve as a common electrode. According to the this embodiment, the pixel electrode 51 is used as an anode electrode, and the opposite electrode 60 is used as a cathode electrode. Alternatively, the pixel electrode 51 may be used as a cathode electrode, and the opposite electrode 60 may be used as an anode electrode.

Although in the above-described embodiment, a case where the intermediate layer 55 is formed inside the opening 53 and thus a separate light emitting material is formed for each pixel is described as an example, the present invention is not limited thereto. The intermediate layer 55 may be formed on the whole fourth insulation layer 50 regardless of the location (or position) of the pixel electrode 51. In this case, the intermediate layer 55 may be formed, for example, by vertically stacking or mixing light-emitting layers including light-emitting materials for emitting red light, green light, and blue light. If white light is emitted, another color light may be formed by mixing the red light, the green light, and the blue light with the white light. In addition, a color filter or a color conversion layer for converting the emitted white light into a color (e.g., a predetermined color) light may be further provided.

When the organic light-emitting display device is a top-emission type for implementing (or projecting) an image counter to the substrate 1, the opposite electrode 60 is a transparent electrode and the pixel electrode 51 is a reflective electrode. The reflective electrode may be formed by thinly depositing a metal having a low work function, such as Ag, Mg, Al, Pt, Pd, Au, Ni, Nd, Ir, Cr, Li, Ca, LiF, or a combination thereof. In the back plane for a flat panel display, according to an embodiment of the present invention, the opposite electrode 60 may be formed to allow light to transmit therethrough.

Referring to FIG. 12, the back plane for a flat panel display includes the transistor area 1 and the storage area 2. Because an embodiment where the organic light-emitting display device is a top-emission type is illustrated in FIG. 12, a light-emitting area may overlap with the transistor area 1 and the storage area 2, and thus, the light-emitting area is not separately classified.

The transistor area 1 includes the TFT serving as a driving device. The TFT includes the gate electrode 21, the active layer 31, and source and drain electrodes 41a and 41b. The TFT may be a bottom-gate type having a structure in which the gate electrode 21 is formed under the active layer 31. In addition, the TFT may be an oxide semiconductor TFT in which an oxide semiconductor is included in the active layer 31.

The storage area 2 includes the first capacitor Cst. The first capacitor Cst includes the first electrode 22-1 and the second electrode 22-3, and the insulation pattern layer 22-2 is interposed between the first electrode 22-1 and the second electrode 22-3. The first electrode 22-1, the insulation pattern layer 22-2, and the second electrode 22-3 may be formed in the same layer as the gate electrode 21 by using the half-tone mask. After the first electrode 22-1, the insulation pattern layer 22-2, and the second electrode 22-3 are sequentially stacked on the substrate 10, the first electrode 22-1, the insulation pattern layer 22-2, and the second electrode 22-3 may be patterned concurrently (e.g., at once). The first electrode 22-1 may be formed of the same material as the gate electrode 21.

The thickness and composition material of the insulation pattern layer 22-2 may be adjusted regardless of the structure of the transistor area 1. Thus, the capacity of the first capacitor Cst may be increased by reducing (or minimizing) the thickness or by using a material having a high dielectric constant.

In addition, the storage area 2 may further include the third and fourth electrodes 42 and 52 corresponding to the first capacitor Cst. The first insulation layer 20 and the second insulation layer 30 are interposed between the third electrode 42 and the second electrode 22-3, and the third insulation layer 40 is interposed between the fourth electrode 52 and the third electrode 42. Thus, in the storage area 2, at least three capacitors may be obtained from the first capacitor 22, the third electrode 42, and the fourth electrode 52.

In addition, the fourth electrode 52 may be used as an auxiliary electrode to maintain a voltage of the opposite electrode 60.

According to an embodiment of the present invention, an organic light-emitting device may be formed at a lighting area of the back plane illustrated in FIG. 1, such that the back plane may be used as a back plane for an organic light-emitting display. However, the present invention is not limited thereto. For example, when a liquid crystal is positioned between the pixel electrode 41 and the opposite electrode 45, the back plane illustrated in FIG. 1 may be used as a back plane for a liquid crystal display device.

Except for a process of forming a light-emitting layer in FIG. 12, seven masks may be used to manufacture the back plane as described with reference to FIGS. 1 through 11. In the first mask process, a structure that may be formed through two or more mask processes may be formed through only one mask process by using the half-tone mask M1.

The above-described removal of a stacked layer during each mask process performed to form an organic light emitting display device may be achieved by dry etching or wet etching. Although a single transistor and a single capacitor are illustrated in the above-described embodiments, this illustration is only for convenience of explanation and the present invention is not limited thereto. According to an embodiment, as long as the number of mask processes used is not increased, a plurality of TFTs and a plurality of capacitors may be included.

According to an embodiment of the present invention, manufacturing cost may be reduced due to a decrease of the number of total masks. In addition, low resistance wiring and high-capacity capacitors, which may be used in a large flat panel display, may be obtained.

While the present invention has been particularly shown and described with reference to example embodiments thereof, it will be understood by those of ordinary skill in the art that various changes in form and details may be made therein without departing from the spirit and scope of the present invention as defined by the following claims, and equivalents thereof.

What is claimed is:

1. A back plane for a flat panel display, the back plane comprising:
   a substrate;
   a gate electrode on the substrate;
   a first capacitor on the substrate, the first capacitor comprising a first electrode, an insulation pattern layer on the first electrode, and a second electrode formed on the insulation pattern layer;
   a first insulation layer on the substrate and covering the gate electrode and the first capacitor, the first insulation layer contacting the first electrode, the insulation pattern layer, and the second electrode;
   an active layer on the first insulation layer to correspond to the gate electrode; and
   a source electrode and a drain electrode on the substrate to contact a portion of the active layer,
   wherein the gate electrode and the first capacitor are formed at the same layer, the first electrode comprises a same material as the gate electrode, and the insulation pattern layer comprises different material from the gate electrode.

2. The back plane of claim 1, further comprising a third electrode corresponding to the first capacitor, and at a same layer as the source electrode and the drain electrode.

3. The back plane of claim 1, further comprising a second insulation layer on the first insulation layer to cover the active layer, the second insulation layer comprising a first hole and a second hole for exposing a portion of the active layer, wherein the source electrode and the drain electrode are on the second insulation layer and fill the first hole and the second hole.

4. The back plane of claim 2, further comprising a third insulation layer on the first insulation layer to cover the source electrode, the drain electrode, and the third electrode, wherein the third insulation layer comprises a third hole for exposing a portion of the source electrode or drain electrode.

5. The back plane of claim 4, further comprising a pixel electrode on the third insulation layer and filling the third hole, and electrically coupled to the source electrode or the drain electrode through the third hole.

6. The back plane of claim 4, further comprising a fourth electrode on the third insulation layer and corresponding to the first capacitor.

7. The back plane of claim 5, further comprising:
   a fourth insulation layer covering an edge of the pixel electrode on the third insulation layer and comprising an opening for exposing at least a portion of the pixel electrode;
   an intermediate layer on the pixel electrode exposed by the opening and comprising an organic light emission layer; and
   an opposite electrode opposite to the pixel electrode, the intermediate layer interposed between the opposite electrode and the pixel electrode.

8. The back plane of claim 1, wherein the active layer comprises an oxide semiconductor.

9. The back plane of claim 1, wherein the gate electrode and the first capacitor are formed by using a half-tone mask.

10. The back plane of claim 1, wherein locations of lateral sides of the first electrode, insulation pattern layer, and second electrode are identical to each other.

11. The back plane of claim 1, wherein a dielectric constant of the insulation pattern layer is higher than that of the first insulation layer.

12. The back plane of claim 1, wherein the insulation pattern layer comprises at least one material selected from among ZrOx, HfOx, AlOx, SiNx, SiNOx, and SiOx.

13. A method of manufacturing a back plane for a flat panel display, the method comprising:
    forming a first capacitor and a gate electrode on a substrate, the first capacitor comprising a first electrode, an insulation pattern layer on the first electrode, and a second electrode on the insulation pattern layer;
    forming a first insulation layer on the substrate and covering the first capacitor and the gate electrode, the first insulation layer contacting the first electrode, the insulation pattern layer, and the second electrode;
    forming an active layer on the first insulation layer to correspond to the gate electrode;
    forming a second insulation layer, which covers the active layer while providing first and second holes for exposing a portion of the active layer, on the first insulation layer; and
    forming a source electrode and a drain electrode on the substrate to contact a portion of the active layer,
    wherein the gate electrode and the first capacitor are formed at the same layer, the first electrode comprises a same material as the gate electrode, and the insulation pattern layer comprises different material from the gate electrode.

14. The method of claim 13, wherein the forming the source electrode and drain electrode comprises further forming a third electrode corresponding to the first capacitor.

15. The method of claim 13, wherein the source electrode and the drain electrode are on the second insulation layer and fill the first hole and the second hole.

16. The method of claim 14, further comprising forming a third insulation layer on the second insulation layer to cover the source electrode, the drain electrode, and the third electrode, wherein the third insulation layer comprises a third hole for exposing a portion of the source electrode or drain electrode.

17. The method of claim 16, further comprising forming a pixel electrode on the third insulation layer and filling the third hole, the pixel electrode being electrically coupled to the source electrode or the drain electrode through the third hole.

18. The method of claim 17, wherein the forming the pixel electrode further comprises forming a fourth electrode on the third insulation layer to correspond to the first capacitor.

19. The method of claim 17, further comprising forming a fourth insulation layer to cover an edge of the pixel electrode on the third insulation layer, the fourth insulation layer comprising an opening for exposing at least a portion of the pixel electrode.

20. The method of claim 19, further comprising forming an intermediate layer comprising an organic light emission layer on the pixel electrode exposed by the opening; and forming an opposite electrode opposite to the pixel electrode, the intermediate layer interposed between the opposite electrode and the pixel electrode.

21. The method of claim 13, wherein the active layer comprises an oxide semiconductor.

22. The method of claim 13, wherein the forming the first capacitor and the gate electrode comprises forming the gate electrode and the first capacitor by using a half-tone mask.

23. The method of claim 13, wherein locations of lateral sides of the first electrode, the insulation pattern layer, and the second electrode are identical to each other.

24. The method of claim 13, wherein a dielectric constant of the insulation pattern layer is higher than that of the first insulation layer.

25. The method of claim 13, wherein the insulation pattern layer comprises at least one material selected from among ZrOx, HfOx, AlOx, SiNx, SiNOx, and SiOx.

* * * * *